(12) United States Patent
Pohl et al.

(10) Patent No.: US 6,364,751 B1
(45) Date of Patent: Apr. 2, 2002

(54) METHOD FOR SINGLING SEMICONDUCTOR COMPONENTS AND SEMICONDUCTOR COMPONENT SINGLING DEVICE

(75) Inventors: Jens Pohl, Bernhardswald; Oliver Wutz, Laaber; Johann Winderl, Neunburg V.W., all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/546,421

(22) Filed: Apr. 10, 2000

(30) Foreign Application Priority Data

Apr. 9, 1999 (DE) .......................................... 199 16 071

(51) Int. Cl.⁷ ................................................ B28D 1/04
(52) U.S. Cl. ........................ 451/55; 125/23.02; 83/746
(58) Field of Search ...................... 451/55; 83/451–466, 83/746–820; 125/23.02

(56) References Cited

U.S. PATENT DOCUMENTS

| 3,465,481 | A | * | 9/1969 | Szwarcman | .................. 451/55 |
| 4,444,078 | A | * | 4/1984 | Pearl | ........................... 83/451 |
| 5,458,269 | A | | 10/1995 | Loomis | |
| 5,702,492 | A | | 12/1997 | Elsbree | |
| 5,915,370 | A | * | 6/1999 | Casper | ................ 125/23.02 X |

FOREIGN PATENT DOCUMENTS

| EP | 0 734 824 A2 | | 10/1996 | |
| JP | 0272509 | * | 11/1988 | .............. 125/23.02 |
| JP | 0041209 | * | 2/1990 | .............. 125/23.02 |
| JP | 8-17765 | | 1/1996 | |

* cited by examiner

Primary Examiner—Joseph J. Hail, III
Assistant Examiner—Anthony Ojini
(74) Attorney, Agent, or Firm—Herbert L. Lerner; Laurence A. Greenberg; Werner H. Stemer

(57) ABSTRACT

Semiconductor components, which each include at least one semiconductor chip mounted on a common carrier substrate, are singled. The separation is effected by severing of the carrier substrate. The carrier substrate is thereby bent at least in that area of the carrier substrate which is to be severed. The severing takes place beginning from the convexly curved surface of the carrier substrate. In addition, the invention describes a singling device for separating semiconductor components.

16 Claims, 3 Drawing Sheets

METHOD FOR SINGLING SEMICONDUCTOR COMPONENTS AND SEMICONDUCTOR COMPONENT SINGLING DEVICE

BACKGROUND OF THE INVENTION

Field of the Invention

The invention lies in the semiconductor technology field. More specifically, the present invention relates to a method for singling, i.e., dicing or separating, semiconductor components. Each of the components which are to be separated comprise at least one semiconductor chip which are mounted on a common carrier substrate. The semiconductor chips may be partly or completely surrounded by an encapsulation compound. The components are separated by severing the carrier substrate, if appropriate additionally by severing parts of the encapsulation compound on the carrier substrate. The finished components may in principle be in any desired arrangement, such as for example a ball grid array, a pin grid array, or the like.

The present invention furthermore comprises a singling device for separating semiconductor components.

In the production of semiconductor components, semiconductor chips are generally arranged on a carrier substrate, for example a carrier tape, a leadframe or a ceramic substrate, during the mounting operation. The entire configuration of the semiconductor chips on the carrier substrate can then be processed further and, if appropriate, encapsulated by an encapsulation compound. In a final step, the individual semiconductor components are detached from the overall assembly on the carrier substrate. This process is generally referred to as singling, separating, or dicing. For this purpose, the carrier substrate is severed around the semiconductor chip or around the semiconductor component, so that an individual semiconductor component is formed.

SUMMARY OF THE INVENTION

It is accordingly an object of the invention to provide a singling method and a singling device for semiconductor components, which overcomes the above-mentioned disadvantages of the heretofore-known devices and methods of this general type and which enables the singling of semiconductor components to take place as efficiently and as gently as possible.

With the foregoing and other objects in view there is provided, in accordance with the invention, a method of singling semiconductor components each formed with at least one semiconductor chip mounted on a common carrier substrate, which comprises:

bending a carrier substrate carrying a plurality of semiconductor chips to form a convexly curved surface; and severing the carrier substrate beginning from the convexly curved surface, produced in the bending step, and singling individual semiconductor components.

In accordance with an added feature of the invention, prior to the severing step, the carrier substrate is placed on a curved base in an area of the carrier substrate to be severed, and the carrier substrate is caused to become connected to the base in a form-fitting manner by generating a vacuum between the base and the carrier substrate, i.e., the substrate is aspirated onto the base.

In accordance with an alternative feature of the invention, the carrier substrate is first freely suspended, at least in an area to be severed, and then pressure-exerting elements are pressed onto a surface of the carrier substrate. In a preferred embodiment of the invention, the pressure-exerting elements are pressure rollers.

In other words, there is provision for the carrier substrate to be bent at least in that area of the carrier substrate which is to be severed. The resultant curvature of the carrier substrate places one of the surfaces of the substrate under tensile stress. The severing of the carrier substrate then begins from this surface, which has acquired a convex curvature as a result of the bending. It is thus ensured that there is scarcely any material warpage caused by displacement of the material of the carrier substrate during the severing operation, and consequently the surface remains free of defects. The severing operation itself is also facilitated, since it is possible to use a lower mechanical pressure, resulting in more gentle severing of the carrier substrate.

The bending of the carrier substrate can be achieved in various ways. For example, it is possible for the carrier substrate, at least in the area which is to be severed, to be placed on a curved base prior to the severing operation. The carrier substrate can then be sucked onto the base in a form-fitting manner due to the generation of a vacuum between the base and the carrier substrate and can thus be connected to the surface of the base. This may, for example, be achieved by means of a suitable vacuum arrangement which is coupled to the surface of the base.

As an alternative, it is also possible for the carrier substrate, prior to the severing operation, to be suspended freely at least in the area which is to be severed. It is then possible for pressure-exerting elements to be pressed onto the surface of the carrier substrate from one side of the carrier substrate in the area which is to be severed, so that the carrier substrate is bent toward the opposite surface of the carrier substrate. The pressure-exerting elements used may, for example, be rollers. However, the carrier substrate may also be guided so as to slide over corresponding pressure-exerting elements.

In principle, various processes can be used to sever the carrier substrate, such as for example abrasive parting. Preferably, however, a cutting process is used. Ideally, a saw with a cutting blade made from hardened metal, i.e., carbide metal or sintered carbide, or ceramic can be used for this process.

Saw blades whose materials and shape have been adapted to the specific requirements involved in processing semiconductors are already known from U.S. Pat. No. 5,702,492. However, those saw blades from the prior art are designed for working on semiconductor wafers, not for separating semiconductor components from an overall assembly on a carrier substrate. During parting of components, such saw blades generally result in cut edges which are not clean, owing to contamination or "fraying" of the cut edges.

The number and position of severing operations carried out on the carrier substrate are selected according to the size of the semiconductor components and the distances between the individual semiconductor chips or semiconductor components and the distances between the semiconductor chips and the edge of the carrier substrate. Consequently, at least one severing of the carrier substrate is carried out between in each case two components or semiconductor chips. Depending on the nature and size of the carrier substrate, it may also be necessary to sever the carrier substrate between the components and the edge of the carrier substrate. However, it is also possible for two severing operations, which are spaced apart from one another, of the carrier substrate to be carried out at least between some of the components. This is useful in particular in those areas in which the distance between the components is relatively great and it would be desirable to achieve semiconductor components which are as small as possible. If two severing operations are carried out between the components, instead of only one, the resulting size of the semiconductor components is reduced accordingly. Ideally, the two severing operations are carried out simultaneously, in order to make the time required for this process step as short as possible.

In accordance with another feature of the invention, therefore, the severing step comprises cutting the carrier substrate along at least one line between in each case two components.

In accordance with again another feature of the invention, the severing step further comprises severing the carrier substrate also between the components and an edge of the carrier substrate.

In accordance with a further feature of the invention, the carrier is severed along two spaced-apart lines severing the carrier substrate between at least some of the components. The two-line severing may be staggered in time or it may be effected simultaneously.

With the above and other objects in view there is also provided, in accordance with the invention, a singling device for separating semiconductor components, comprising:

a holding device for holding a common carrier substrate with a plurality of semiconductor chip mounted thereon; and at least one saw blade formed of hardened metal or ceramic for sawing the common carrier substrate.

The saw blade may be two mutually spaced-apart, parallel saw blades.

The holding device, according to an additional feature of the invention, has means for bending the carrier substrate to be severed toward the at least one saw blade. The bending means may be pressure rollers or a vacuum chuck with a curved surface. The bending means bend the carrier substrate to be severed toward the one or two saw blades.

In other words, the parting device according to the invention for separating semiconductor components has at least one saw blade made from hardened metal, i.e., sintered carbide, or ceramic. These materials are regarded as being particularly advantageous for such applications. Finally, a further saw device according to the invention is proposed, which has two saw blades which are spaced apart from one another and are arranged parallel to one another. These saw blades may in particular consist of sintered carbide or ceramic, as described with regard to the first parting device according to the invention.

Other features which are considered as characteristic for the invention are set forth in the appended claims.

Although the invention is illustrated and described herein as embodied in a method for dicing semiconductor components, and a dicing device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
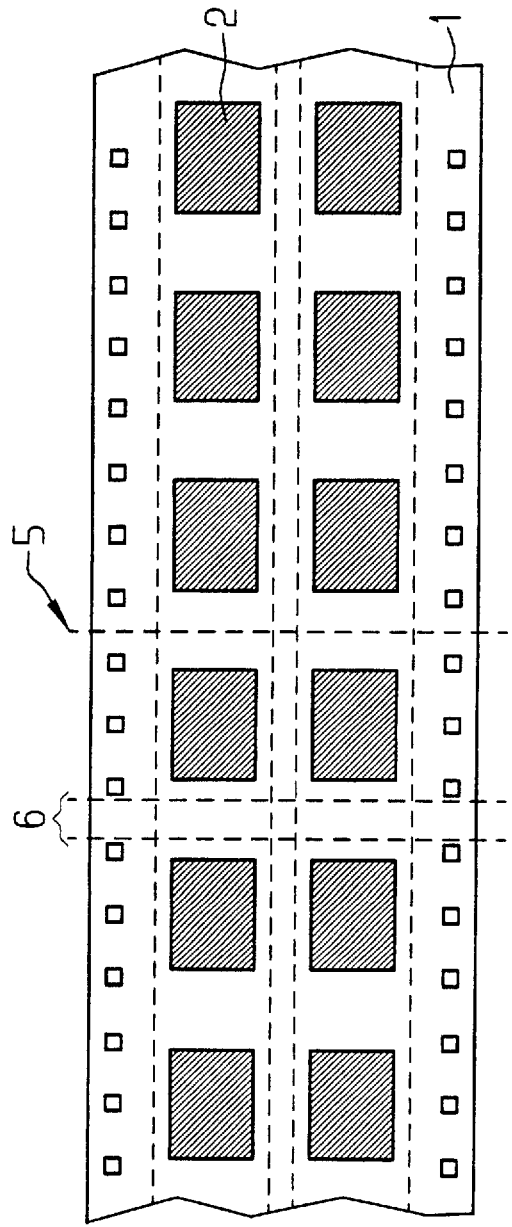
FIG. 1A is a partial top plan view onto a carrier substrate with a plurality of semiconductor chips prior to separation.
Figure 1B:
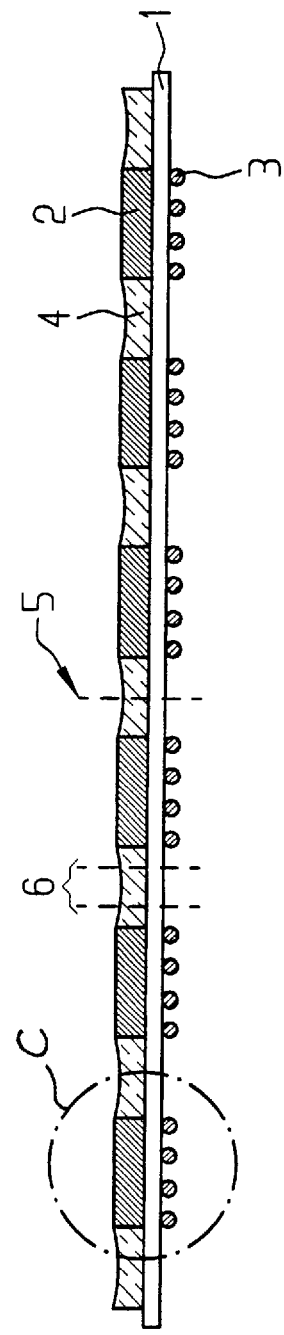
FIG. 1B is a partial side elevational view thereof.
Figure 1C:
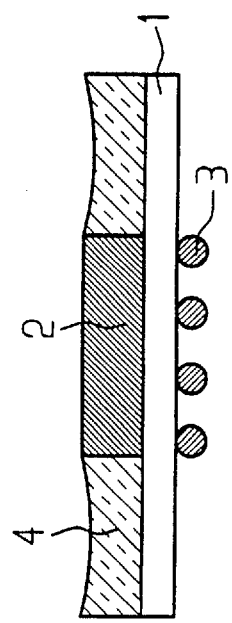
FIG. 1C is an enlarged side view of the detail C in FIB. 1B.

Referring now to the figures of the drawing in detail and first, particularly, to FIG. 1 thereof, there is shown, in FIG. 1A, a plan view of a carrier substrate 1 on which a large number of semiconductor chips 2 are arranged. FIG. 1B shows a cross section through FIG. 1A, in the longitudinal direction of the carrier substrate. The semiconductor chips 2 arranged on the carrier substrate 1 are surrounded at the sides by an encapsulation compound 4 and are conductively connected to contact balls 3 on the opposite side of the carrier substrate 1. FIG. 1 shows an enlarged detail of FIG. 1B (within the circle C), from which the subsequently diced semiconductor component as a ball grid array component can already been seen.

Figure 2A:
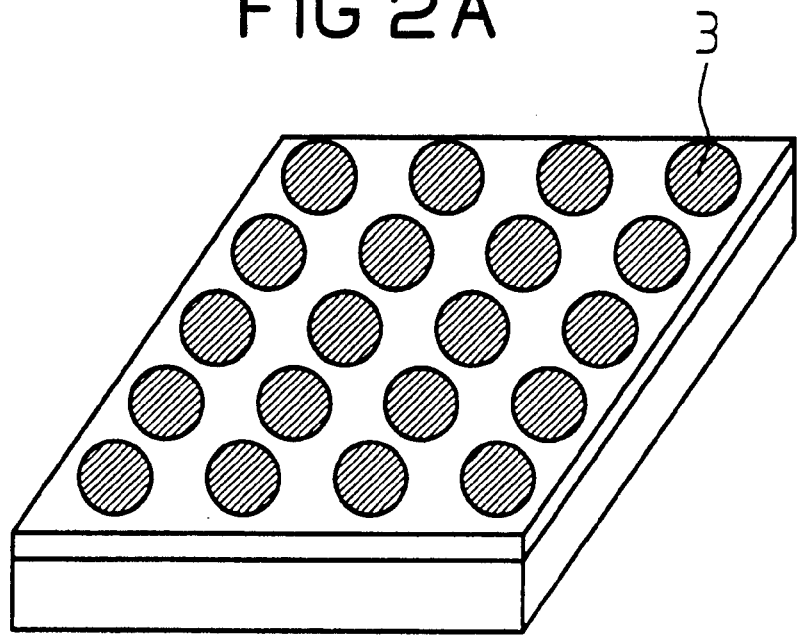
FIG. 2A is a bottom perspective view of a semiconductor component following a dicing operation.
Figure 2B:
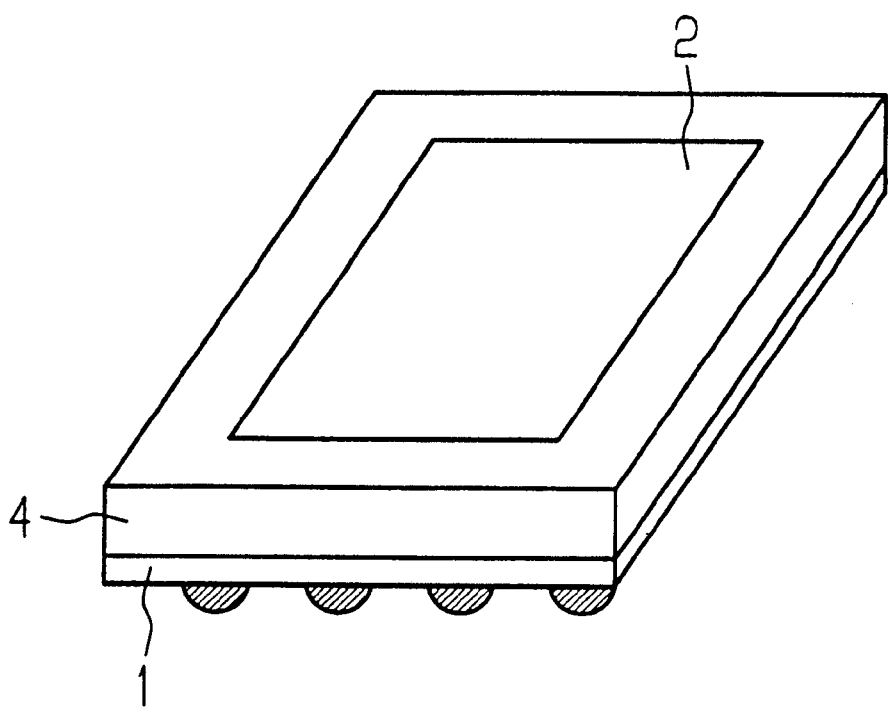
FIG. 2B is a top perspective view thereof.
Figure 3:
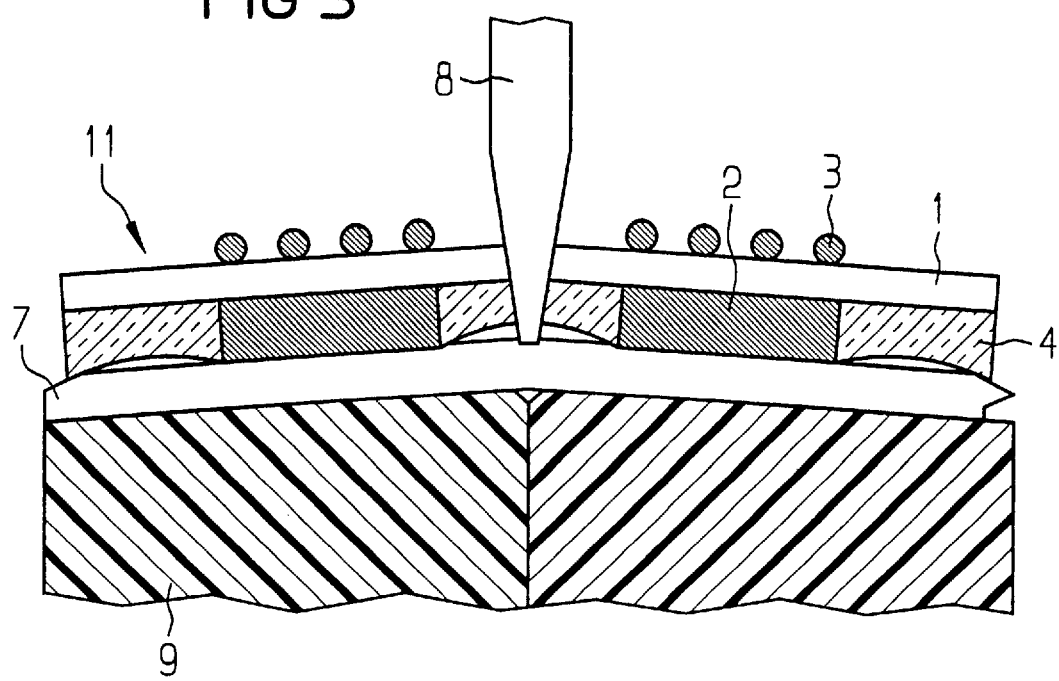
FIG. 3 is a partial sectional view showing the severing of a bent carrier substrate using one saw blade.

FIGS. 2A and 2B show the ball grid array component which has already been separated. FIG. 2A illustrates the underside bearing the contact balls 3 of the component. FIG. 2B shows the top side together with the semiconductor chip 2 and the encapsulation 4.

In a first exemplary mode of the invention, the components are separated with the aid of a single saw blade, preferably made from sintered carbide or ceramic. In this case, that side of the carrier substrate 1 on which semiconductor chips are arranged is guided over a curved surface of a vacuum chuck 9. Preferably, a sawing foil 7 may also be inserted between the carrier substrate 1 or the semiconductor chips 2 and the curved surface.

Once the carrier substrate 1 is aspirated onto the curved surface as a result of a vacuum being applied, a convexly curved surface 11 which is under a tensile stress is formed on that side of the carrier substrate 1 on which the contact balls 3 are arranged. Then, starting from this curved surface 11, the carrier substrate can be severed significantly more easily by a saw blade 8. The tensile stress which is present on the carrier substrate 1 makes it easier for the saw blade 8 to penetrate into the carrier substrate and thus to sever the carrier substrate.

Figure 4:
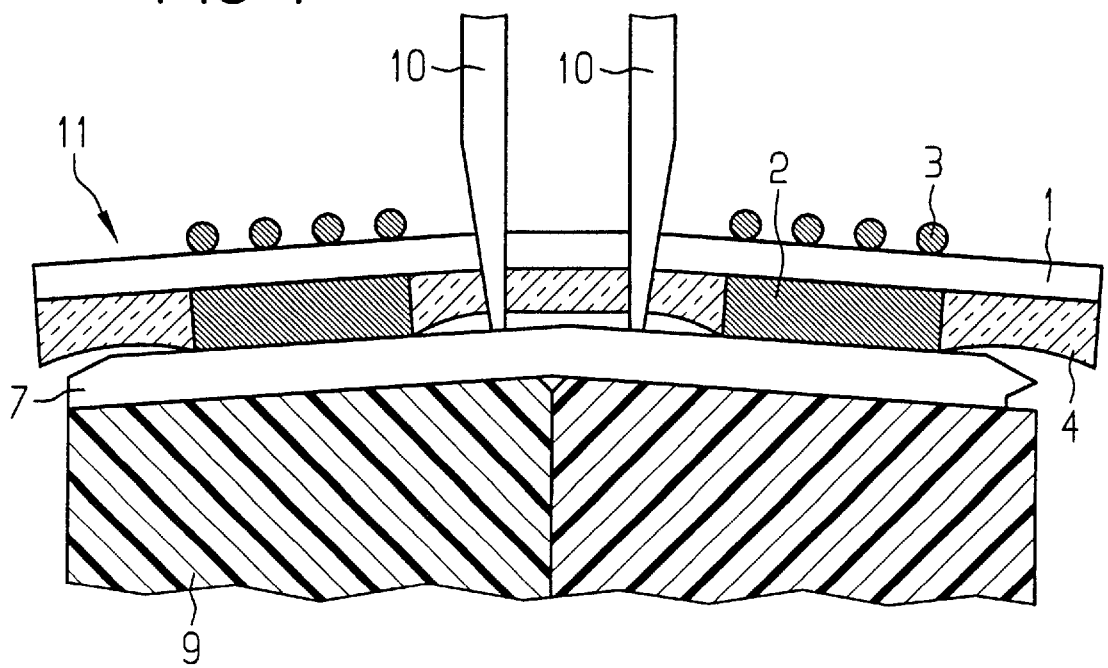
FIG. 4 is a partial sectional view showing the severing of a bent carrier substrate using two saw blades.

In an alternative mode of the invention, which is shown in FIG. 4, the substrate is severed not just with a single saw blade 8, but rather with two saw blades 10. The two blades 10 are spaced a given distance from one another, and they are used simultaneously to sever the carrier substrate. The result of this process, as shown in FIG. 1A, is not just one cut line 5 between two semiconductor chips 2, but rather two cut lines 6, which run parallel to one another between the semiconductor chips 2. The material of the carrier substrate 1 and, if appropriate, the encapsulation compound 4 which lies between the two cuts 6 is removed, so that the dimensions of the separated semiconductor components are smaller than in the case of a single cut 5 between the semiconductor chips 2. Consequently, even if the distances between the semiconductor chips 2 on the carrier substrate 1 are relatively great, it is possible to produce separated semiconductor components which are as small as possible without loss of time during the process. In principle, of course, the two cuts 6 may also be carried out by a single saw blade 8, but in this case one cut has to be carried out after the other, and consequently the process time is extended.

We claim:

1. A method of singling semiconductor components each formed with at least one semiconductor chip mounted on a common carrier substrate, which comprises:

bending a carrier substrate carrying a plurality of semiconductor chips to form a convexly curved surface;

bending a carrier substrate carrying a plurality of semiconductor chips to form a convexly curved surface;

severing the carrier substrate beginning from the convexly curved surface, produced in the bending step by cutting the carrier substrate with a parting device having at least one cutting blade, the at least one cutting blade being made of a material selected from the group consisting of hardened metal and ceramic severing step including cutting; and singling individual semiconductor components.

2. The method according to claim 1, which comprises, prior to the severing step, placing the carrier substrate on a curved base in an area of the carrier substrate to be severed, and causing the carrier substrate to become connected to the base in a form-fitting manner by generating a vacuum between the base and the carrier substrate.

3. The method according to claim 1, wherein the bending step comprises, prior to the severing step, freely suspending the carrier substrate at least in an area to be severed, and then pressing pressure-exerting elements onto a surface of the carrier substrate.

4. The method according to claim 3, wherein the pressure-exerting elements are pressure rollers.

5. The method according to claim 1, wherein the severing step comprises cutting the carrier substrate along at least one line between in each case two components.

6. The method according to claim 5, wherein the carrier substrate has an edge adjacent outermost components, and the severing step further comprises severing the carrier substrate also between the components and the edge of the carrier substrate.

7. The method according to claim 5, wherein the at least one line is a part of two spaced-apart lines severing the carrier substrate between at least some of the components.

8. The method according to claim 7, which comprises severing along the two lines simultaneously.

9. A singling device for separating semiconductor components, comprising:

a holding device for holding a common carrier substrate with a plurality of semiconductor chip mounted thereon; and at least one saw blade formed of a material selected from the group consisting of hardened metal and ceramic for sawing the common carrier substrate.

10. The singling device according to claim 9, wherein said holding device comprises means for bending the carrier substrate to be severed toward said at least one saw blade.

11. The singling device according to claim 10, wherein said bending means are pressure rollers.

12. The singling device according to claim 10, wherein said bending means include a vacuum chuck with a curved surface.

13. The singling device according to claim 9, wherein said at least one saw blade is one of two mutually spaced-apart, parallel saw blades.

14. The singling device according to claim 13, wherein said holding device comprises means for bending the carrier substrate to be severed toward said two saw blades.

15. The singling device according to claim 14, wherein said bending means are pressure rollers.

16. The singling device according to claim 14, wherein said bending means include a vacuum chuck with a curved surface.

* * * * *